United States Patent [19]

Kitamura

[11] Patent Number: 5,493,575
[45] Date of Patent: Feb. 20, 1996

[54] EXTERNAL RESONATOR TYPE FREQUENCY-VARIABLE SEMICONDUCTOR LASER LIGHT SOURCE

[75] Inventor: Atsushi Kitamura, Tokyo, Japan

[73] Assignee: Ando Electric Co., Ltd., Tokyo, Japan

[21] Appl. No.: 310,993

[22] Filed: Sep. 23, 1994

[30] Foreign Application Priority Data

Sep. 27, 1993 [JP] Japan .................................. 5-260446

[51] Int. Cl.⁶ .................................................... H01S 3/10
[52] U.S. Cl. ................... 372/20; 372/32; 372/92; 372/102
[58] Field of Search ........................... 372/92, 102, 20, 372/32

[56] References Cited

U.S. PATENT DOCUMENTS

| | | | |
|---|---|---|---|
| 5,347,527 | 9/1994 | Favre et al. | 372/20 |
| 5,428,700 | 6/1995 | Hall | 372/20 |
| 5,442,651 | 8/1995 | Maeda | 372/97 |
| 5,444,724 | 8/1995 | Goto | 372/20 |

*Primary Examiner*—James W. Davie
*Attorney, Agent, or Firm*—Finnegan, Henderson, Farabow, Garrett & Dunner

[57] ABSTRACT

The purpose of the present invention is to provide an external resonator type frequency-variable semiconductor laser light source in which the oscillation frequency of the semiconductor laser can be set lip up at higher resolution. In the present invention, one end face of a semiconductor laser is coated with an antireflection film. The outgoing beam from the end face is incident on a diffraction grating fixed on a rotating stage. A parallel sliding stage moves the rotating stage in parallel with the optical axis of the semiconductor laser by a parallel sliding mechanism driver. A frequency setting part sets arbitrarily the oscillation frequency of the semiconductor laser. A beam splitter splits an outgoing beam from the other end face of tile semiconductor laser into a transmitted beam and a reflected beam. An optical interferometer inputs the reflected beam and outputs an interference output beam. An optical detector inputs the interference output beam and converts it to an electric interference signal. An interference signal processing unit inputs the interference signal to be counted, and outputs a processing signal being proportional with the counted number of interference fringes. A comparator compares a set signal from the frequency setting part with the processing signal and feeds the result back to the parallel sliding mechanism driver.

1 Claim, 2 Drawing Sheets

EXTERNAL RESONATOR TYPE FREQUENCY-VARIABLE SEMICONDUCTOR LASER LIGHT SOURCE

BACKGROUND OF THE INVENTION

Field of the Invention

The present Invention relates to an external resonator type frequency-variable semiconductor laser light source for optical coherent communication, which varies the oscillation frequency of the semiconductor laser while continuing the phase of oscillated light.

Background Art

FIG. 2 is a block diagram showing a conventional external resonator type frequency-variable semiconductor laser light source. In FIG. 2, reference numeral 1 indicates a semiconductor laser, reference numeral 1A indicates an antireflection film reference numeral 3 indicates a diffraction grating 20 reference numeral 4 indicates a rotating stage, reference numeral 5 indicates a parallel sliding stage, reference numerals 6 and 7 indicate lenses, reference numeral 9 indicates a frequency setting part, reference numeral 10 indicates a comparator, reference numeral 11 indicates a parallel sliding mechanism driver, reference numeral 12 indicates a fixed plate, reference numeral 13 indicates an arm, and reference numeral 17 indicates a displacement gauge.

In the arrangement of FIG. 2, one end face of semiconductor laser 1 is coated with antireflection film 1A. From the end face with tile antireflection film, outgoing beam 2B is outputted. The outgoing beam 2B is transformed into a collimated beam via lens 6 and is incident on diffraction grating 3. At this time, diffraction grating 3 and the other end face without an antireflection film of the semiconductor laser form an external resonator whose length is "L". Semiconductor laser 1 oscillates at a single mode and outputs outgoing beam 2A from the other end face.

Here, diffraction grating 3 is fixed on rotating stage 4 and the rotating stage 4 is further fixed on parallel sliding stage 5 which moves in parallel with the light axis of semiconductor laser 1. Furthermore, the rotating stage 4 is in contact with fixed plate 12 via arm 13. Therefore, the parallel motion of parallel sliding stage 5 is transformed to the rotational motion of rotating stage 4; thus, the oscillation frequency of semiconductor 1 is varied under phase-continuous condition by way of the parallel movement of the parallel sliding stage 5.

Frequency setting part 9 sets up the oscillation frequency of semiconductor 1. A set signal from frequency setting part 9 and a displacement signal from displacement gauge 17 which detects the amount of the parallel displacement of parallel sliding stage 5 are compared by comparator 10; and the comparison signal is fed as a control signal back to parallel sliding mechanism driver 11. In this way, the oscillation frequency of semiconductor laser 1 is set arbitrarily within the resolution of displacement gauge 17 under phase-continuous conditions.

On the other hand, outgoing beam 2A from the other end face without an antireflection film of semiconductor laser 1 is transformed into a collimated beam; and the collimated beam becomes an output beam from the external resonator type frequency-variable semiconductor laser light source.

The set resolution of the oscillation frequency of the semiconductor laser is limited by the resolution of the rotation angle of the diffraction grating which acts as an external mirror of the semiconductor laser; thus, in order to raise the set resolution of the oscillation frequency, it is necessary to raise the resolution of the rotation angle of the diffraction grating.

However, in the arrangement of FIG. 2, the rotation angle θ of the diffraction grating is calculated in accordance with the amount of the parallel displacement of the parallel sliding stage; thus, tile set resolution of the oscillation frequency of the semiconductor laser is limited by the resolution of the displacement gauge which detects the amount of the parallel displacement of the parallel sliding stage.

At present, the resolution of the displacement gauge regarded as one having the highest resolution is 20 nm at its best, even if using a strain gauge and so on. Therefore, a problem occurs in that the oscillation frequency of the semiconductor laser cannot be set up at a better resolution than one corresponding to the resolution (20 nm) of the displacement gauge.

SUMMARY OF THE INVENTION

Therefore, the purpose of the present invention is to provide an external resonator type frequency-variable semiconductor laser light source in which the oscillation frequency of the semiconductor laser can be set up at higher resolution.

Therefore, the present invention provides an external resonator type frequency-variable semiconductor laser light source comprising: a semiconductor laser whose one end face is coated with an antireflection film; a diffraction grating fixed on a rotating stage, the diffraction grating for inputting an outgoing beam from the end face coated with an antireflection film so as to form an external resonator with the other end face of the semiconductor laser; a parallel sliding stage for moving the rotating stage in parallel with the optical axis of the semiconductor laser; a parallel-sliding mechanism driver for driving the parallel sliding stage; a frequency setting part for arbitrarily setting the oscillation frequency of the semiconductor laser; a beam splitter for splitting an outgoing beam from the other end face of the semiconductor laser into a transmitted beam and a reflected beam; an optical interferometer for inputting the reflected beam split by the beam splitter and outputting an interference output beam; an optical detector for inputting the interference output beam from the optical interferometer and converting it to an electric interference signal; an interference signal processing unit for inputting the interference signal from the optical detector to be counted, and outputting a processing signal being proportional with the counted number of interference fringes; and a comparator for comparing a set signal from the frequency setting part with the processing signal from the interference signal processing unit and feeding the result back to the parallel sliding mechanism driver.

According to the apparatus described above, the optical interferometer is used in the external resonator type frequency-variable semiconductor laser light source; thus, by way of setting length $L_F$ of the resonator and refractive index n of the optical interferometer in a manner such that either length $L_F$ or refractive index n is sufficiently greater than amount $\Delta f$ of the frequency shift of the semiconductor laser, high resolution of frequency discrimination is obtained in the optical interferometer. Based on the high resolution of frequency discrimination, the oscillation frequency in the semiconductor laser can be set with high resolution.

DESCRIPTION OF PREFERRED EMBODIMENT

Figure 1:
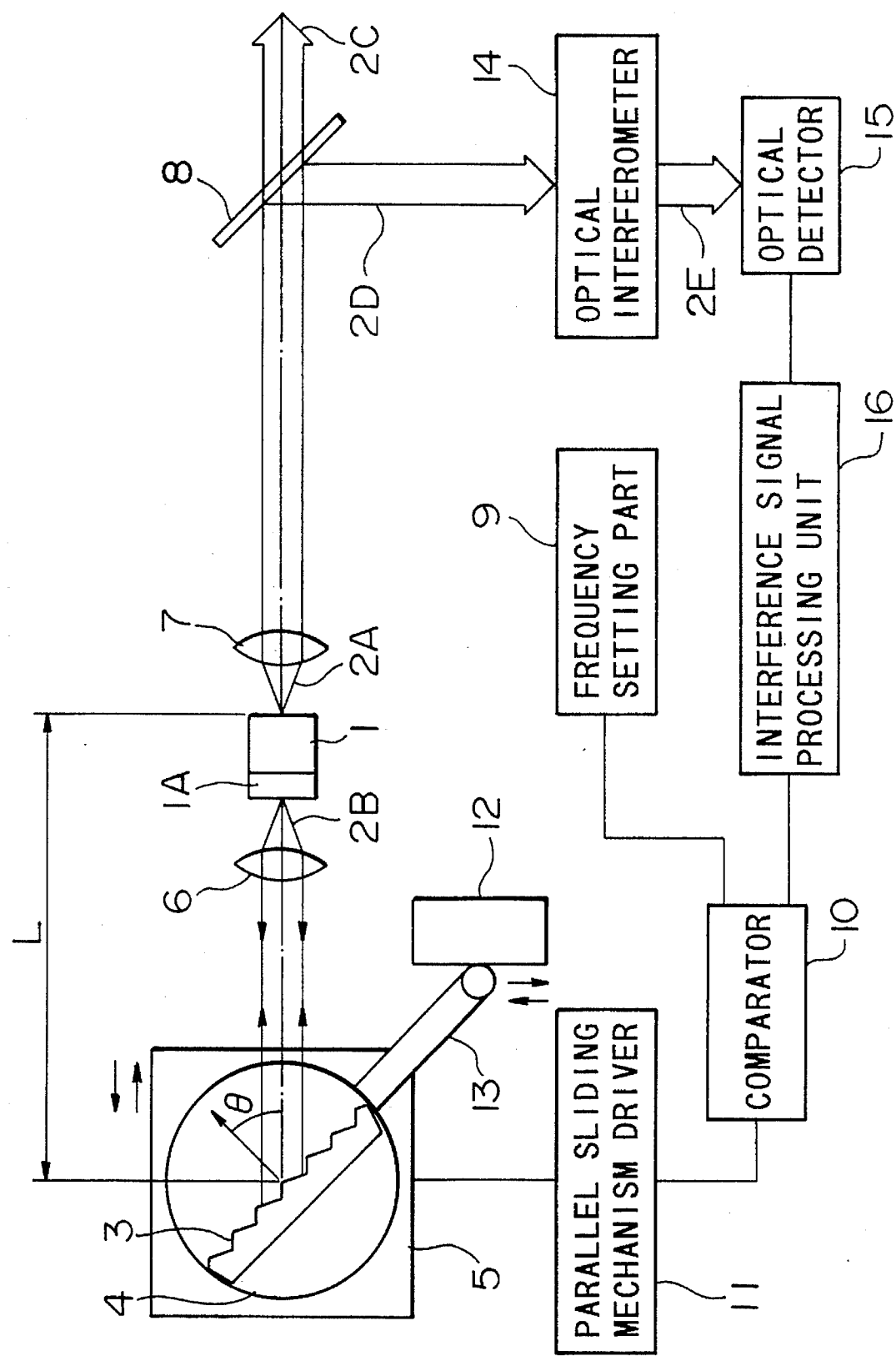
FIG. 1 is a block diagram showing the configuration of the external resonator type frequency-variable semiconductor laser light source according to an embodiment of the present invention.

FIG. 1 is a block diagram showing the external resonator type frequency-variable semiconductor laser light source according to an embodiment of the present invention.

Figure 2:
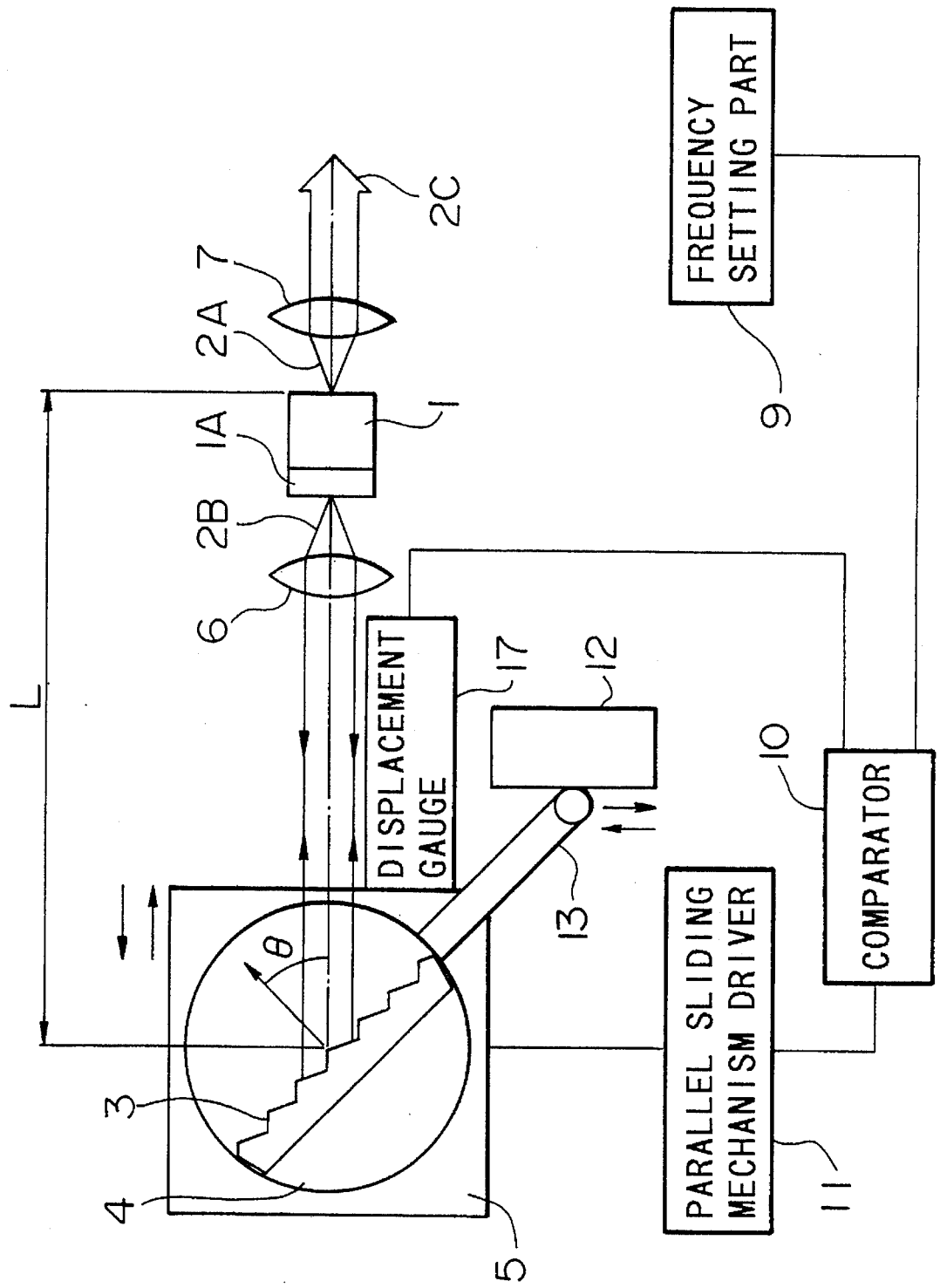
FIG. 2 is a block diagram showing the configuration of a conventional external resonator type frequency-variable semiconductor laser light source.

In FIG. 1, reference numeral 8 indicates a beam splitter, reference numeral 14 indicates an optical interferometer, reference numeral 15 indicates an optical detector, and reference numeral 16 indicates an interference signal processing unit. Other parts in FIG. 2 are the same as those shown in FIG. 2. That is to say, in the arrangement of FIG. 1, beam splitter 8, optical interferometer 14, optical detector 15, and interference signal processing unit 16 replace displacement gauge 17 in FIG. 2.

In FIG. 1, semiconductor laser 1 outputs outgoing beam 2B from the end face with antireflection film 1A. The output beam 2B is transformed into a collimated beam by lens 6 to be incident on diffraction grating 3. At this time, an external resonator is formed by the diffraction grating 3 and the other end face without an antireflection film of semiconductor laser 1; thus, the semiconductor laser 1 oscillates at a single mode and emits outgoing beam 2A from the other end face without an antireflection film.

Diffraction grating 3 is fixed on the rotating stage 4 and the rotating stage 4 is further fixed on parallel sliding stage 5 which moves in parallel with the light axis of semiconductor laser 1. Furthermore, the rotating stage 4 is in contact with fixed plate 12 via arm 13. Therefore, the parallel motion of parallel sliding stage 5 is transformed to the rotational motion of rotating stage 4. The oscillation frequency of semiconductor laser 1 is set by frequency setting part 9. Accordingly, the oscillation frequency of semiconductor 1 is varied under phase-continuous conditions by way of the parallel movement of parallel sliding stage 5.

On the other hand, outgoing beam 2A emitted from the end face without an antireflection film is transformed into a collimated beam by lens 7; and subsequently, the beam is split into transmitted beam 2C and reflected beam 2D by beam splitter 8. The transmitted beam 2C becomes an output beam of the external resonator type frequency-variable semiconductor laser light source.

The reflected beam 2D is incident on optical interferometer 14 which has a function of frequency discrimination; and the beam is further outputted as an interference output beam 2E having the number N of interference fringes which corresponds to the amount Δf of frequency shift of semiconductor laser 1. The interference output beam 2E is incident on optical detector 15 and is converted to an electrical interference signal therein.

Interference signal processing unit 16 inputs the interference signal from the optical detector 15 and counts the number N of interference fringes of the interference output beam 2E so as to convert the signal to a processing signal being proportional to the number N of interference fringes. Comparator 10 treats the set signal from frequency setting part 9 and the processing signal from interference signal processing unit 16 as inputs; and comparator 10 compares the set signal with the processing signal. The result is fed back to parallel sliding mechanism driver 11; therefore, the oscillation frequency of semiconductor 1 is set up within a range corresponding to the characteristic of the frequency discrimination of the optical interferometer.

If the amount Δf of frequency shift is constant; then, the greater the number N of interference fringes, the higher the characteristic of the frequency discrimination, and the set resolution of the oscillation frequency becomes higher.

Here, for example, if a Fabry-Pérot-type interferometer having a resonator with length $L_F$ is used as optical interferometer 14, the number N of interference fringes of interference output beam 2E which corresponds to the amount Δf of frequency shift is represented by the following formula, in which N is the number of interference fringes, n is the refractive index, C is the light velocity, $L_F$ is the length of the resonator, and Δf is the amount of the frequency shift.

$$N=(2 \cdot n \cdot L_F \cdot \Delta f)/C$$

Therefore, to increase the length $L_F$ of the resonator or to raise the refractive index n leads to the increase of the number N of interference fringes; thus, the set resolution of the oscillation frequency in the semiconductor laser 1 can be increased.

What is claimed is:

1. An external resonator type frequency-variable semiconductor laser light source comprising:

a semiconductor laser whose one end face is coated with an antireflection film;

a diffraction grating fixed on a rotating stage, the diffraction grating for inputting an outgoing beam from the end face coated with an antireflection film so as to form an external resonator with the other end face of the semiconductor laser;

a parallel sliding stage for moving the rotating stage in parallel with the optical axis of the semiconductor laser;

a parallel sliding mechanism driver for driving the parallel sliding stage;

a frequency setting part for arbitrarily setting the oscillation frequency of the semiconductor laser;

a beam splitter for splitting an outgoing beam from the other end face of the semiconductor laser into a transmitted beam and a reflected beam;

an optical interferometer for inputting the reflected beam split by the beam splitter and outputting an interference output beam;

an optical detector for inputting the interference output beam from the optical interferometer and converting it to an electric interference signal;

an interference signal processing unit for inputting the interference signal from the optical detector to be counted, and outputting a processing signal being proportional with the counted number of interference fringes; and a comparator for comparing a set signal from the frequency setting part with the processing signal from the interference signal processing unit and feeding the result back to the parallel sliding mechanism driver.

* * * * *